(12) United States Patent
Hamashima et al.

(10) Patent No.: US 7,205,559 B2
(45) Date of Patent: Apr. 17, 2007

(54) ELECTRON BEAM APPARATUS AND DEVICE MANUFACTURING METHOD USING SAME

(75) Inventors: Muneki Hamashima, Saitama (JP); Takao Kato, Tokyo (JP); Mamoru Nakasuji, Kanagawa (JP); Nobuharu Noji, Kanagawa (JP); Tohru Satake, Kanagawa (JP)

(73) Assignee: Ebara Corporation, Tokyo (JP)

( * ) Notice: Subject to any disclaimer, the term of this patent is extended or adjusted under 35 U.S.C. 154(b) by 140 days.

(21) Appl. No.: 10/697,647

(22) Filed: Oct. 31, 2003

(65) Prior Publication Data

US 2004/0135515 A1 Jul. 15, 2004

Related U.S. Application Data

(63) Continuation of application No. PCT/JP02/04327, filed on Apr. 30, 2002.

(30) Foreign Application Priority Data

| May 1, 2001 | (JP) | ............... 2001-133925 |
| May 16, 2001 | (JP) | ............... 2001-146792 |
| May 23, 2001 | (JP) | ............... 2001-153711 |

(51) Int. Cl.
*A61N 5/00* (2006.01)
*G01K 1/08* (2006.01)
*H01J 29/70* (2006.01)

(52) U.S. Cl. ............ 250/492.3; 250/397; 250/398; 313/413; 313/421

(58) Field of Classification Search ............ 315/5.41, 315/14, 17; 250/310, 397–398, 491.1, 492.1, 250/492.3; 313/409, 413, 421
See application file for complete search history.

(56) References Cited

U.S. PATENT DOCUMENTS

| 4,798,957 A | * | 1/1989 | Tolner ............... 250/396 R |
| 4,900,982 A | * | 2/1990 | Kolpin ............... 313/452 |
| 5,502,306 A | | 3/1996 | Meisburger et al. ...... 250/310 |
| 5,557,105 A | | 9/1996 | Honjo et al. ......... 250/310 |
| 5,864,142 A | | 1/1999 | Muraki et al. ......... 250/491.1 |
| 5,892,224 A | | 4/1999 | Nakasuji ............ 250/310 |
| 6,038,018 A | * | 3/2000 | Yamazaki et al. ....... 356/237.1 |

(Continued)

FOREIGN PATENT DOCUMENTS

EP 0 518 633 A1 12/1992

(Continued)

*Primary Examiner*—Thuy Vinh Tran
(74) *Attorney, Agent, or Firm*—Westerman, Hattori, Daniels & Adrian, LLP.

(57) ABSTRACT

An electron beam apparatus including an electron gun for directing a plurality of primary electron beams onto a sample, an objective lens for forming an electric field to accelerate a plurality of secondary electron beams emitted from the sample, and a separator for separating the plurality of secondary electron beams from a primary optical system and for directing the plurality of secondary electron beams into a secondary optical system for guiding to a detector outputting a detection signal of the secondary electron beams. A deflector deflects the secondary electron beams in the secondary optical system. The deflector is controlled to deflect the plurality of secondary electron beams synchronously with scanning of the plurality of primary electron beams, thereby preventing the plurality of secondary electron beams from moving on the detector in response to the scanning of the plurality of primary electron beams.

9 Claims, 11 Drawing Sheets

U.S. PATENT DOCUMENTS

| | | | |
|---|---|---|---|
| 6,232,040 B1 * | 5/2001 | Katsap et al. | 430/296 |
| 6,259,094 B1 * | 7/2001 | Nagai et al. | 250/310 |
| 6,400,090 B2 * | 6/2002 | Katsap et al. | 315/111.81 |
| 6,465,783 B1 | 10/2002 | Nakasuji | 250/311 |
| 6,476,390 B1 | 11/2002 | Murakoshi et al. | 250/310 |
| 6,518,582 B1 * | 2/2003 | Kohama | 250/492.2 |
| 6,586,736 B1 * | 7/2003 | McCord | 250/310 |
| 6,765,217 B1 * | 7/2004 | Nishimura et al. | 250/491.1 |

FOREIGN PATENT DOCUMENTS

| | | |
|---|---|---|
| JP | 5-82607 | 4/1993 |
| JP | 5-258703 | 10/1993 |
| JP | 9-219427 | 8/1997 |
| JP | 10-313027 | 11/1998 |
| JP | 11-132975 | 5/1999 |
| JP | 111-48905 A | 6/1999 |
| JP | EP 0 957 583 A2 | 11/1999 |
| JP | EP 1 055 745 A1 | 11/2000 |
| JP | 2002-141010 | 5/2002 |
| JP | 2002-141011 | 5/2002 |
| JP | 2002-150985 | 5/2002 |

* cited by examiner

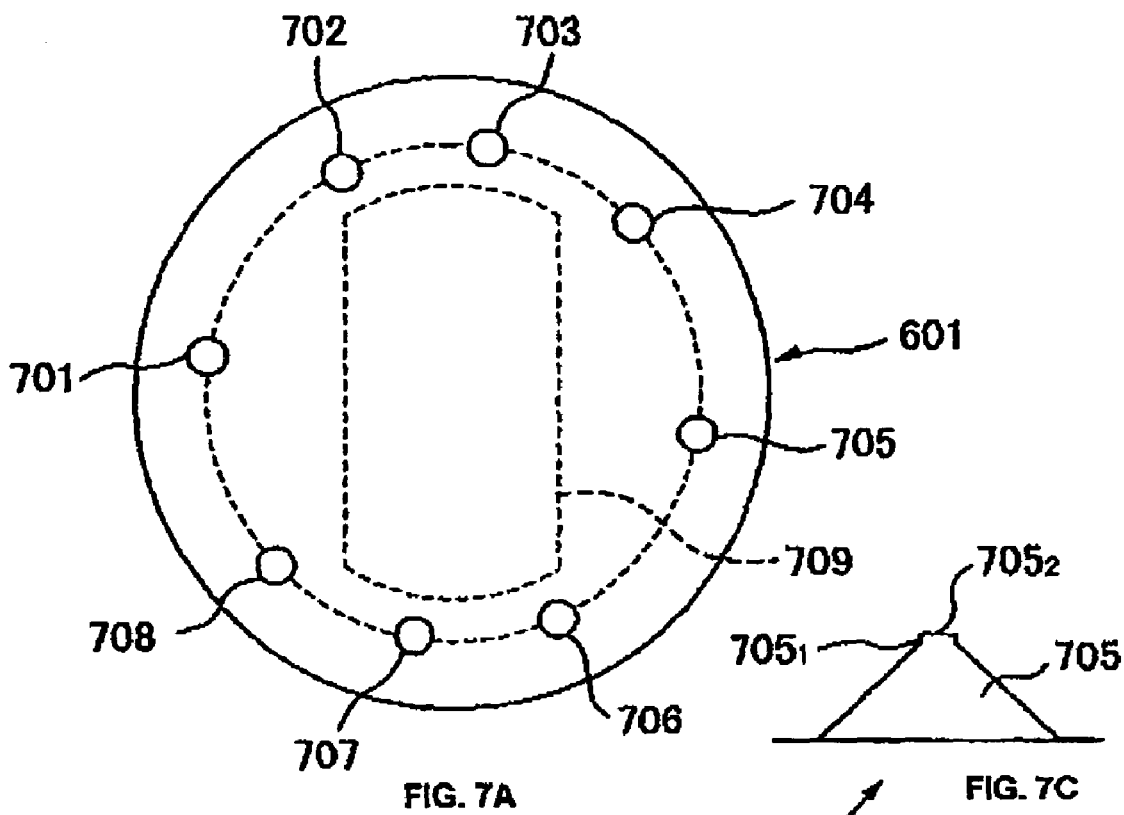
FIG. 7A
FIG. 7C
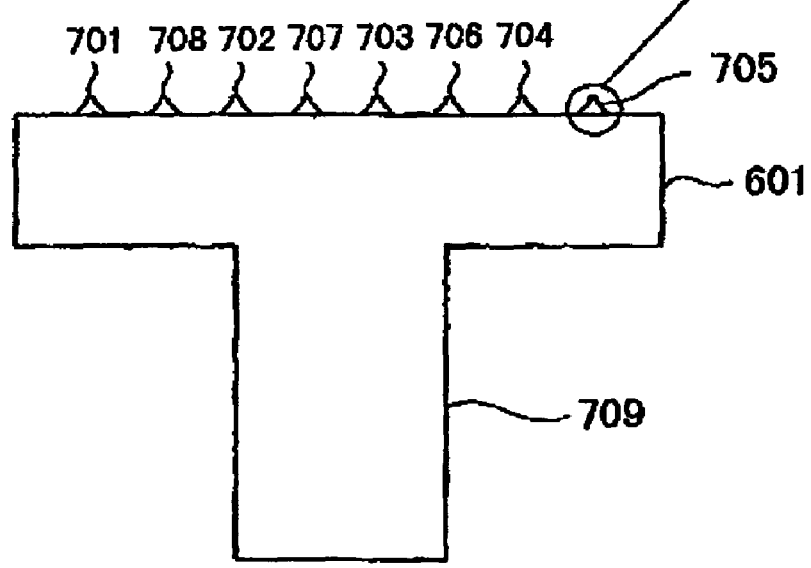
FIG. 7B

ELECTRON BEAM APPARATUS AND DEVICE MANUFACTURING METHOD USING SAME

This application is a continuation of international application PCT/JP02/04327, filed on Apr. 30, 2002.

TECHNICAL FIELD

The present invention relates to a multi-beam type electron beam apparatus, and a semiconductor device manufacturing method which uses such an apparatus to evaluate wafers in the middle of processes for improving the yield. More particularly, the present invention relates to improvements on the configuration of a secondary optical system, a cathode, and an electron gun of a multi-beam type electron beam apparatus.

BACKGROUND ART

Generally, when aberration of an optical system must be limited to a certain value or lower, the optical system is provided with a diaphragm such that the aperture diameter of the diaphragm is adjusted to make the optical system brighter or to improve the resolution of the optical system. Also, when a plurality of beams are handled, a diaphragm is provided at a position at which a principal ray of the plurality of beams intersect with each other, i.e., a cross-over position in a primary optical system.

As described above, while a diaphragm is provided at a cross-over position in a primary optical system for handling a plurality of beams, problems described below arise if the diaphragm is provided in a secondary optical system. Specifically, since the cross-over position cannot be previously predicted in the secondary optical system, a problem arises in that the diaphragm cannot be matched with the cross-over position unless an adjuster lens is provided for adjusting the cross-over position to match the position of the diaphragm. Another problem is experienced when the diaphragm does not match the cross-over position, in which case some of a plurality of secondary electron beams closer to the optical axis are blocked by the diaphragm, so that even though the diaphragm is used to limit aberration of the optical system, the aberration cannot be reduced, resulting in a lower secondary beam detection efficiency and inability to eliminate cross-talk with adjacent beams.

As such, for providing a diaphragm in the secondary optical system, it is necessary to additionally provide a lens for focusing a cross-over image on the diaphragm, and an adjustor lens such as a two-stage lens for adjusting the dimensions of the cross-over at the diaphragm. However, an adjustor lens, if provided, will result in a longer optical system and require an aligner for the adjustor lens. A further problem arises as to the need for an aligner for the diaphragm, and an astigmatism adjuster for the cross-over, resulting in a complicated configuration of the diaphragm, a larger size of the overall apparatus, a longer time needed for adjustments, and a higher cost.

Thus, the utilization of a plurality of electron beams, i.e., multiple beams has been proposed for testing a mask pattern or a wafer for defects of LSI patterns and the like thereon at a high throughput. For example, a technology has been proposed for irradiating a plurality of regions on an object under testing with respective electron beams in order to improve throughput in such a defect detection. Also, another proposition has been made to the use of a field emission cathode which is capable of producing a large electron beam current at a low voltage when a fine pattern on the order of 0.1 micron is tested for defects using a low-energy electron beam.

However, when an array of field emission cathodes, which are inherently instable in operation, is used for an electron gun in a defect detection apparatus to generate multiple beams, even one field emission cathode in the array incapable of emission would cause the apparatus itself to fail to operate, possibly resulting in a significantly reduced operating rate.

Also, the instable operation of the field emission cathodes as mentioned above causes problems of difficulties in identifying fluctuations in emissions from the field emission cathodes and signals, and particularly, difficulties in providing an image with a large signal-to-noise ratio due to large shot noise.

In addition, a conventional electron gun of the multi-beam type electron beam apparatus has the following problems. FIG. 1 is a vertical sectional view schematically illustrating an exemplary conventional electron gun 100. An insulating ceramics 108 is supported within a cylindrical electron gun body 106. A bottom face of a ceramic seat 109 is fixed on a top face of the insulating ceramics 108. A single emitter 101 is fixed on a top surface of the ceramic s at 109 such that it is heated by a heater 3 which is a heating means. A lead for the heater 103, and high voltage cables 107 for a cathode extend from a bottom face of the insulating ceramics 108.

A Wehnelt member, i.e., Wehnelt electrode 102 is fitted over the cylindrical electron gun body 106. The Wehnelt electrode 102 has one end (upper end in the figure) integrally formed with an end wall which is provided with a single small hole (Wehnelt hole) 110.

The Wehnelt electrode 102 is fixed by a stop ring 104 at a position at which its end wall section is in close proximity to the emitter 101. The Insulating ceramics 108 can be finely adjusted in its position in the horizontal direction by a plurality of finely movable screws 105 which extend through a peripheral wall of the electron gun body 106. Through the adjustment, the emitter 101 supported by the ceramic seat 109 on the insulating ceramics 108 is brought into alignment with the hole 110 provided through the end wall of the Wehnelt electrode 102.

However, there are problems in applying the method of finely adjusting the relative position between the single emitter 101 and Wehnelt electrode 102 as mentioned to an electron gun which comprises a multi-emitter having a plurality of emitters.

First, when the insulating ceramics is finely moved to finely adjust the multi-emitter in its in-plane position through the ceramic seat, the multi-emitter can be inclined. While the inclination does not constitute a grave problem for the single emitter, the inclined multi-emitter would result in different distances between the Wehnelt electrode and all emitters, and accordingly inconsistent emissions of electrons.

A second problem, which is also true for the single emitter, is that when the entire Wehnelt electrode is moved to adjust the axial distance between the Wehnelt electrode and multi-emitter, the Wehnelt electrode can be bumped against the multi-emitter which could thereby be broken.

DISCLOSURE OF THE INVENTION

The present invention has been proposed to solve the conventional problems mentioned above, and the present invention essentially provides an electron beam apparatus which is capable of reliably evaluating a sample such as a wafer, a mask and the like having a pattern with the minimum line width of 0.1 μm or less at a high throughput using a plurality of electron beams, i.e., multiple beams, an electron beam apparatus which comprises an electron gun for generating multiple beams using a plurality of emitter, particularly, an electron gun which is capable of accurately and readily making fine adjustments of relative positions between the plurality of emitters and a Wehnelt electrode which has holes corresponding to the plurality of emitters, and a device manufacturing method for evaluating a wafer using such an electron beam apparatus to improve the yield.

Specifically, it is a first object of the present invention to provide an electron beam apparatus which is capable of limiting aberration of a secondary optical system without the need for providing a diaphragm in the optical system.

It is a second object of the present invention to provide an electron beam apparatus for forming multiple beams using an electron gun which comprises a multi-emitter type thermal cathode with small shot noise.

It is a third object of the present invention to provide an electron beam apparatus which is capable of maintaining consistent emissions of electrons and accurately conducting a test using an electron gun which can ensure the parallelism between a multi-emitter having a plurality of emitters and a Wehnelt electrode to readily and accurately align one to the other.

It is a fourth object of the present invention to provide a device manufacturing method which uses such an electron beam apparatus to offer a high manufacturing yield.

To achieve the above objects, the present invention provides an electron beam apparatus for irradiating a first aperture plate having a plurality of apertures with electron beams emitted from an electron beam source to generate a plurality of primary electron beams, directing the primary electron beams onto a sample, separating secondary electrons emitted from the sample from a primary optical system to form a plurality of secondary electron beams, and directing a plurality of secondary electron beams into a secondary optical system as groups of secondary electrons for guiding to a detector, and outputting a detection signal of the secondary electron beams from the detectors wherein the electron beam apparatus comprises a plurality of apertures corresponding to the plurality of secondary electron beams in front of an incident plane of the detector.

In one embodiment of the present invention, the plurality of primary electron beams and the plurality of secondary electron beams are arranged in the vicinity of an optical axis, and the plurality of apertures are formed in the shape of an ellipse which is longer in a radial direction, an X-axis direction of XY-coordinates, and/or a Y-axis direction of the XY-coordinates from the optical axis in a plane orthogonal to the optical axis.

The electron beam apparatus may further comprise a number of memories twice as much as the number of the detectors for storing digital signals generated by A/D converting the detection signals, and change-over switches disposed in front of and at the back of the memories, wherein the detection signals from the detectors in one scanning operation are input in one of the memories while the previous detection signals stored in another of the memories can be transmitted into a CPU or an image processing unit.

In one embodiment of the present invention, it is necessary to deflect the plurality of secondary electron beams such that they do not move on the second aperture plate In synchronism with scanning of the plurality of primary electron beams.

Also, to achieve the above objects, the present invention provides an electron beam apparatus for narrowly converging a plurality of electron beams, simultaneously scanning the electron beams on a sample, accelerating secondary electrons from each scanned region of the sample using an objective lens, narrowly converging the secondary electrons, separating the secondary electrons from a primary optical system by an ExB separator, increasing the interval between the narrowly converged secondary electrons using at least one stage of lens after the separation, and guiding the secondary electrons to a number of secondary electron detectors corresponding to the number of beams, wherein an aperture plate having a plurality of apertures, the diameter of which is determined to prevent different groups of secondary electrons from introducing thereinto, is disposed in front of the secondary electron detectors.

Also, to achieve the above objects, the present invention provides an electron beam apparatus for evaluating a sample. The electron beam apparatus comprises means for emitting electron beams, a first aperture plate for forming a plurality of primary electron beams arranged in a circumferential direction about an optical axis of a primary optical system, scanning means for simultaneously scanning the plurality of primary electron beams on the sample, means for forming a plurality of secondary electron beams separated from the primary optical system and arranged in a circumferential direction about an optical axis of a secondary optical system from secondary electrons emitted from the sample, a detector for detecting the plurality of secondary electron beams, and a second aperture plate having a plurality of apertures, disposed on one side of the detector on which the secondary electron beams are incident, wherein the apertures of the second aperture plate are formed to permit secondary electron beams associated therewith to pass therethrough and to prevent secondary electron beams not associated therewith from passing therethrough.

In one embodiment of the present invention, the second apertures have, for example, a circumferential dimension reduced about an optical axis of the secondary optical system, thereby preventing adjacent secondary electron beams not associated therewith from passing therethrough. The apertures of the second aperture plate may be reduced in a dimension in a non-scanning direction orthogonal to a primary electron beam scanning direction.

Also, to achieve the above objects, the present invention provides an electron beam apparatus which is characterized by comprising a thermal cathode which is machined by electric discharge machining using a discharge machining electrode formed with a plurality of recesses of a predetermined size at predetermined positions.

In one embodiment of the present invention, a surface under machining of the thermal cathode subjected to the electric discharge machining is polished to a mirror-smooth state prior to the electric discharge machining.

Also, to achieve the above objects, the present invention provides an electron beam apparatus comprising a thermal cathode which is machined by electric discharge machining using a discharge machining electrode formed with one or a plurality of recesses of a predetermined size at predetermined positions, wherein the thermal cathode comprises a plurality of bumps which are created by electric discharge machining at positions corresponding to the recesses on the surface under machining, and each of the bumps has a mirror polished top surface.

In one embodiment of the present invention, the top surfaces of the plurality of bumps are mechanically polished or chemically mechanically polished after the electric discharge machining.

Also, to achieve the above objects, the present invention provides an electron beam apparatus comprising an electron gun which includes a multi-emitter machined as a cathode including a plurality of integrated emitters, heater for heating the multi-emitter, fixing means for fixing the multi-emitter and the heater at given positions, a Wehnelt electrode, and a fine adjustment mechanism for finely adjusting the position of a portion of the Wehnelt electrode which is adjacent to the multi-emitter, wherein the fine adjustment mechanism is configured to be able to finely adjust the portion of the Wehnelt electrode in at least one of an x-direction, a y-direction, and a θ-direction in a plane parallel to a plane which includes the multi-emitter, and a tilt direction in a plan perpendicular to the plane.

In one embodiment of the present invention, the portion of the Wehnelt electrode has a plurality of small holes corresponding to the plurality of emitters, and advantageously has a thickness of 200 μm or less only in the vicinity of the holes.

Also, to achieve the above objects, the present invention provides an electron beam apparatus comprising an electron gun having a cathode member, a Wehnelt member, and an anode member, wherein a portion of the Wehnelt member adjacent to the cathode member can be separated from the rest of the Wehnelt member, and can be finely moved in an x-, a y-, or a z-direction orthogonal to one another.

In one embodiment of the present invention, the electron beam apparatus forms a plurality of reduced electron beams from emissions of any of the electron guns, scans a sample surface with the electron beams, and detects secondary electron beams formed of secondary electrons emitted from scanned positions on the sample surface using a plurality of detectors.

Further, to achieve the above objects, the present invention provides a device manufacturing method for evaluating a wafer after the end of each wafer process for at least one wafer process using any of the aforementioned electron beam apparatus.

The above and other objects and features of the present invention will become more apparent from the following detailed description when read with reference to the accompanying drawings.

BRIEF DESCRIPTION OF THE DRAWINGS

FIGS. 7A to 7C are diagrams illustrating the structure of a multi-emitter type thermal cathod for us in the electron beam apparatus illustrated in FIG. 6A, wherein FIG. 7A is a plan view, FIG. 7B is a side view, and FIG. 7C is an enlarged view of a bump;

FIGS. 8A and 8B are diagrams illustrating the structure of discharge machining electrode for manufacturing the thermal cathode illustrated in FIGS. 7A to 7C, wherein FIG. 8A is a plan view, and FIG. 8B is a cross-sectional view;

BEST MODE FOR CARRYING OUT THE INVENTION

Figure 1:
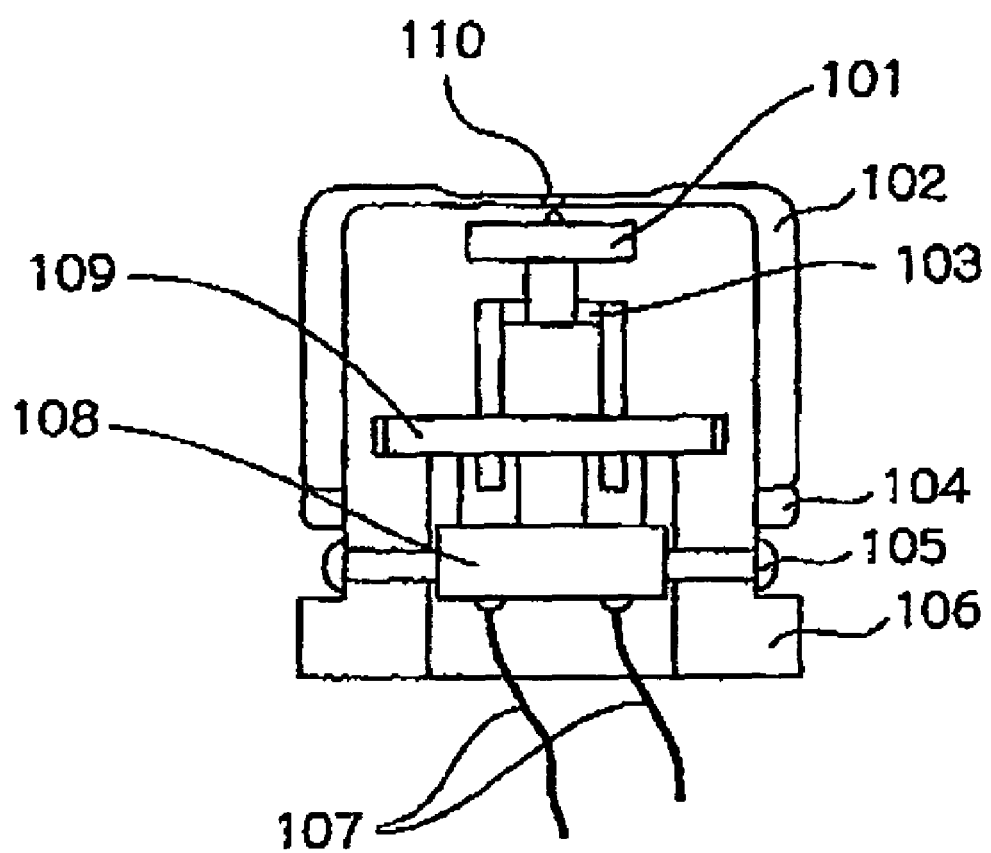
FIG. 1 is a vertical sectional view schematically illustrating an exemplary conventional electron gun.
Figure 2:
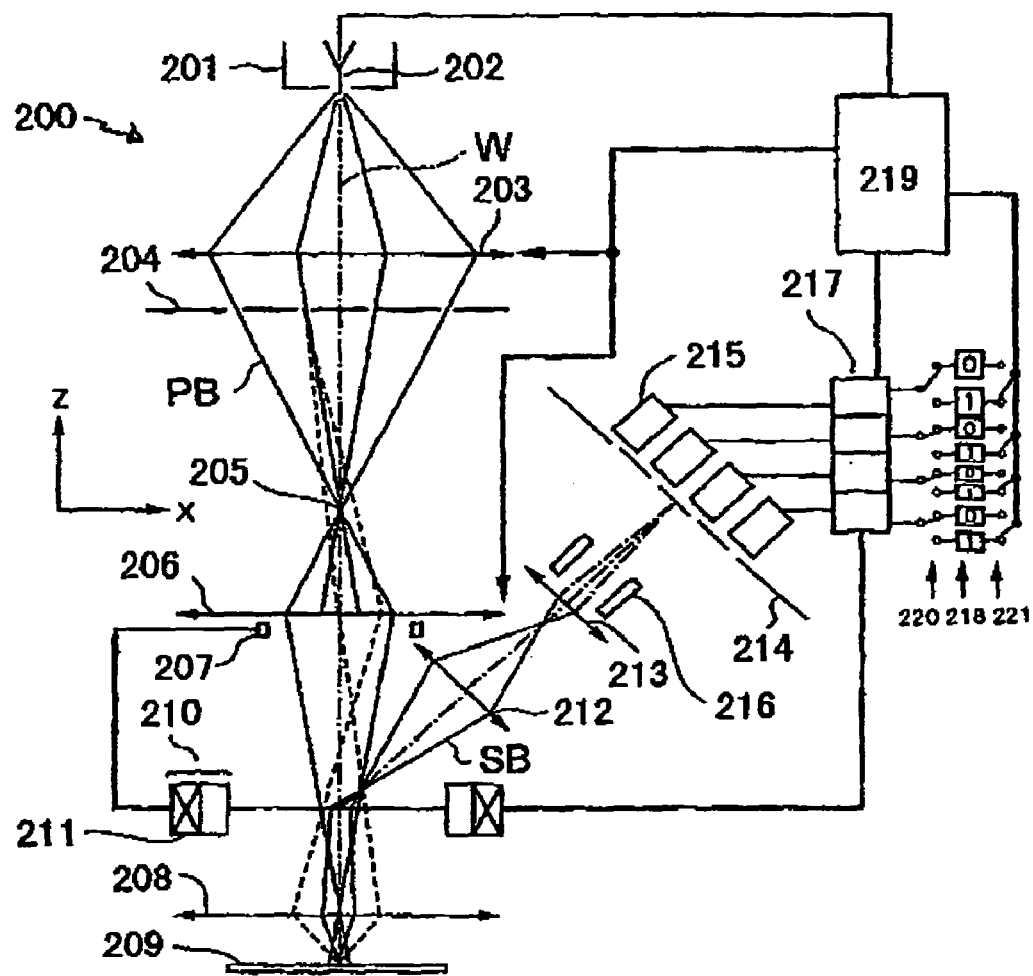
FIG. 2 is a diagram schematically illustrating the configuration of a first embodiment of an electron beam apparatus according to the present invention.

In the following, several embodiments of an electron beam apparatus according to the present invention will be described with reference to the drawings. FIG. 2 is a diagram schematically illustrating a first embodiment of the electron beam apparatus according to the present invention. In FIG. 2, the electron beam apparatus 200 comprises an electron gun 201 as an electron beam source. An electron beam emitted from an emitter 202 of the electron gun 201 is converged by a condenser lens 203 to form a cross-over at a point 205.

A first multi-aperture plate 204 having, for example, four apertures is disposed below the condenser lens 203. The four apertures of the first multi-aperture plate 204 are formed along the circumference of the first multi-aperture plate 204. Therefore, the electron beam emitted from the electron gun 201 is irradiated to the first multi-aperture plate 204 to form four primary electron beams PB about an optical axis W.

In this way, in this embodiment, the electron gun 201 and first multi-aperture plate 204 make up an electron beam forming apertures for forming four primary electron beams PB about the optical axis W. Dotted lines represent how an aperture image is focused.

Each of the four primary electron beams PB formed by the first multi-aperture plate 204 is reduced by a reducing lens 206, and focused on a sample 209 by an objective lens 208. The four primary electron beams PB exiting from the first multi-aperture plate 204 are deflected to simultaneously scan on the surface of the sample 209 by an electrostatic deflector 207 disposed between the reducing lens 206 and objective lens 208 and by an electromagnetic deflector 211 of an ExB separator 210.

A plurality of focused primary electron beams PB are irradiated onto the sample 209 to scan four points ther on. Secondary electrons emitted from these irradiated four points are accelerated by an electric field applied between the objective lens 208 and sample 209. In this way, the secondary electrons, which are emitted at a large angle to the normal of the sample surface, are also finely converged into four fine secondary electron beams SB (i.e., four fine secondary electron beams) which pass through the objective lens 208 and are deflected by the ExB separator 210. Thus, the secondary electron beams SB are separated from the primary optical system for irradiating the sample 209, and introduced into a secondary optical system.

The secondary optical system has magnifying lenses 212, 213. The four secondary electron beams SB, which have passed through these magnifying lenses 212, 213, are spaced from adjacent beams at wider intervals by a larger spacing, focused on four apertures of a second multi-aperture plate 214, and guided to four detectors 215. The second multi-aperture plate 214 is disposed in front of an incident plane of the detectors 215. The four apertures of the second multi-aperture plate 214 are formed along the circumference of the second multi-aperture plate 214, and correspond one-to-one to the four apertures formed through the first multi-aperture plate 204. Consequently, the four primary electron beams PB and four secondary electron beams SB are distributed over the circumference about the optical axis W.

A deflector 216 is also disposed between the magnifying lens 213 and second multi-aperture plate 214. The four secondary electron beams SB, which have passed through the magnifying lens 213, can be deflected by the deflector 216 in synchronism with the scanning of the four primary electron beams PB such that they do not move on the second multi-aperture plate 214.

Each of the detectors 215 outputs the focused secondary electron beam to an amplification/processing unit 217 in the form of an electric signal indicative of its intensity (detection signal of the secondary electron beam). The amplification/processing unit 217 amplifies received electric signals by amplifiers (not shown), respectively, and then converts them from analog signals to digital signals by A/D converters (not shown) for storage in memories 218. The number of memories 218 for secondary electronic signals is twice the number of multiple beams. The digital signals output from the A/D converters of the amplification/processing unit 217 are handled such that while a signal corresponding to one scanning operation is input to one side (designated by "0") of the memories 218, a signal stored on the other side (designated by "1") of the memories 218 is read into a CPU 219 or processed thereby, and upon termination of the scanning, change-over switches 220, 221, disposed in front of and at the back of the memories 218 are switched to input a signal produced in the next scanning operation to the memory "1" and send a signal in the memory "0" to the CPU 219.

The CPU 219 is supplied with a scanning signal for deflecting the primary electron beam PB applied to the electromagnetic deflector 211. The CPU 219 synthesizes image data from this scanning signal and the aforementioned digital signals, so that an image forming unit, not shown, can construct or display an image representative of a scanned surface of the sample 209.

Defects on the sample 209 can be detected by comparing the image data with reference image data of the sample which is free from defects.

Also, a pattern under measurement of the sample 209 is moved close to the optical axis W of the primary optical system through registration (alignment calibration), and scanned in lines to extract a line width evaluation signal which can be calibrated as appropriate to measure a line width of the pattern on the sample 209.

Next, description will be made on the apertures of the second multi-aperture plate 214 which is a feature of this embodiment. As described above, since the second optical system is not provided with a diaphragm for limiting aberration of the optical system, beam spots of the four secondary electron beams SB have large extent on the second multi-aperture plate 214. Therefore, a certain aperture of the second multi-aperture plate 214 is passed by another secondary electron beam in addition to a secondary electron beam which should pass through the aperture, possibly causing so-called cross-talk. To solve this problem, the present invention forms the four apertures of the second multi-aperture plate 214 such that different groups of secondary electron beams (in other words, secondary electron beams not corresponded or not associated therewith) will not introduce thereinto.

Figure 3:
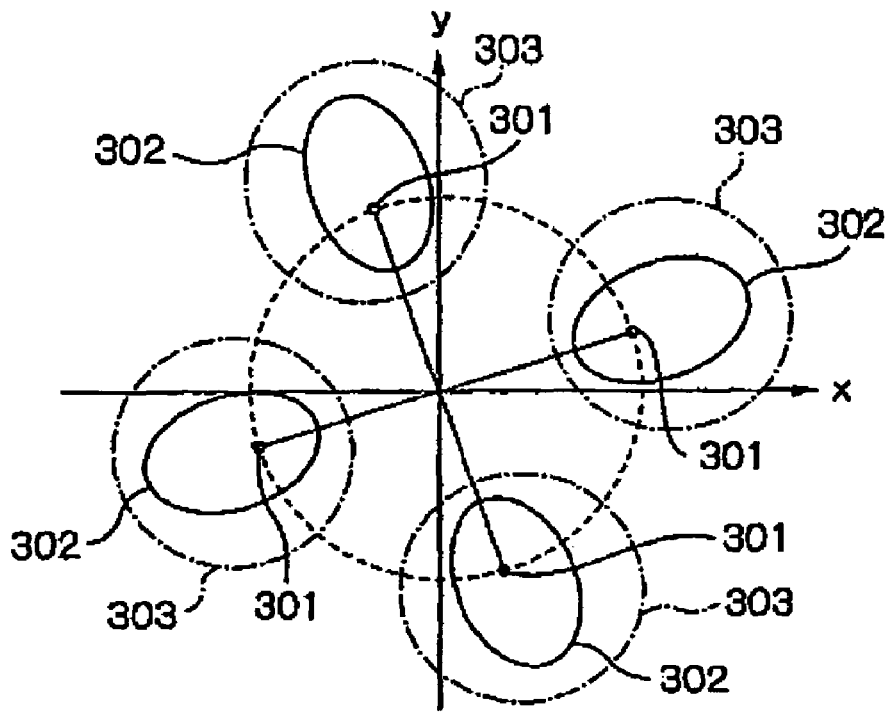
FIG. 3 is a plan view schematically illustrating exemplary apertures of a second multi-aperture plate which can be applied to the first embodiment illustrated in FIG. 2.

In FIG. 3, reference numeral 301 designates a position at which a principal ray of secondary electron beams is incident on the second multi-aperture plate 214; reference numeral 302 designates an aperture of the second multi-aperture plate 214; and reference numeral 303 designates a beam receiving surface of the detector 215.

As Illustrated in FIG. 3, the four apertures 302 of the second multi-aperture plate 214 can be formed in the shape of an ellipse which is longer in a radial direction from the optical axis in a plane perpendicular to the optical axis. Stated another way, the circumferential dimension is reduced about the optical axis of the secondary optical system. In this way, adjacent secondary electron beams, not associated with an aperture, can be prevented from passing through the aperture. Simultaneously, it is possible to efficiently collect secondary electrons which spread in the radial direction due to aberration. Outside the secondary electron beam incident position 301 in the radial direction, different groups of secondary electron beams will hardly Introduce into the aperture. Thus, even if the apertures 302 are formed in the shape of an ellipse which is longer in the radial direction from the optical axis as described above, it is sufficiently unlikely that different groups of secondary electron beams introduce into apertures 302 not associated therewith.

When the second multi-aperture plate 214 is formed with the four apertures 302 as illustrated in FIG. 3, the deflection must be provided by the deflector 216 disposed between the magnifying lens 213 and second multi-aperture plate 214, such that four secondary electron beams passing through the magnifying lens 213 will not move on the second multi-aperture plate 214 in synchronism with the scanning of the four primary electron beams, as described above. In this way, even if the primary electron beams are scanned, the respective secondary electron beams can exactly pass through only the apertures 302 associated therewith.

Figure 4:
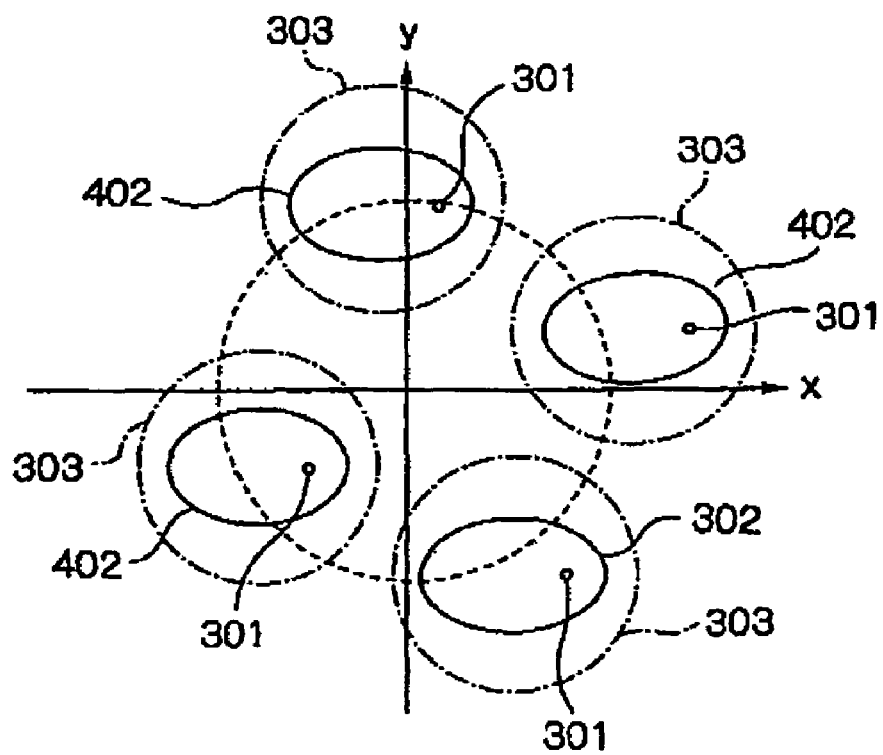
FIG. 4 is a plan view schematically Illustrating other exemplary apertures of the second multi-aperture plate which can be applied to the first embodiment illustrated in FIG. 2.

Also, as illustrated in FIG. 4, the four apertures of the second multi-aperture plate 214 must be formed along the circumferential direction of the second multi-aperture plate 214, such that they are arranged at equal intervals when projected onto the X-axis. The four apertures 402 of the second multi-aperture plate 214 illustrated in FIG. 4 are formed in the shape of an ellipse which is longer in the X-axis direction on the XY-coordinates In a plane perpendicular to the optical axis. For example, when a sample stand is continuously moved in the Y-direction while four primary electron beams are scanned in the X-direction, different groups of secondary electron beams can be prevented from introducing into the apertures 402 not associated therewith, even if the primary beams are scanned in the X-axis direction, by forming the apertures 402 of the second multi-aperture plate 214 in the shape of an ellipse which is longer in the X-axis direction. In other words, since the apertures 402 of the second aperture plate 214 are reduced in the dimension in the non-scanning direction orthogonal to the scanning direction of the primary electron beams, it is unlikely that different groups of secondary electron beams will introduce into apertures 402 not associated therewith.

In addition, the apertures 402 are formed in the shape of an ellipse which is longer in the X-axis direction, so that even if four primary electron beams are scanned in the X-direction, secondary electron beams will move within the respective apertures 402 along the X-direction without exceeding the apertures 402, with the result that the deflector 206 is not necessarily provided. In FIG. 4, 403 indicates a range in which the secondary electrons move in synchronism with scanning.

The apertures of the second multi-aperture plate 214 may be advantageously formed in the shape of an ellipse which is longer in the Y-axis direction on the XY-coordinates in the plane orthogonal to the optical axis. Also, while the second multi-aperture plates 214 illustrated in FIGS. 3 and 4 are formed with four apertures 302, 402, respectively, the number of the apertures 302, 402 are not limited to four, but may be more than that.

Figure 5:
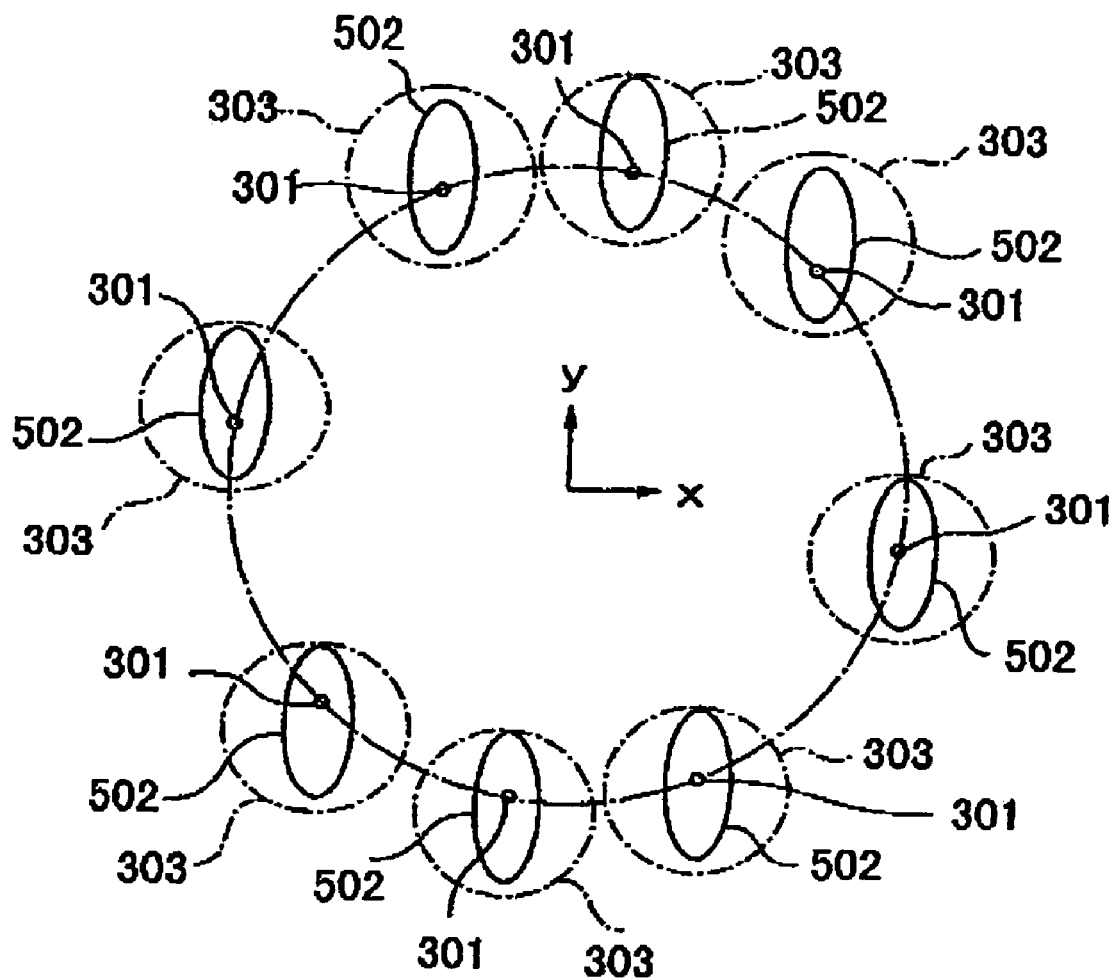
FIG. 5 is a plan view schematically illustrating further exemplary apertures of the second multi-aperture plate which can be applied to the first embodiment illustrated in FIG. 2.

FIG. 5 illustrates the second multi-aperture plate 214 which is formed with eight apertures 502. In this example, as illustrated in FIG. 5, the apertures 502 are at equal intervals when beams are projected onto the x-axis, so that the distance between the beams is shorter in the x-direction, while the distance between the beams is longer in the y-direction. In this event, the apertures 502 are preferably formed in the shape of an ellipse which has a smaller dimension in the x-direction and a larger dimension in the y-direction. The eight apertures 502 of the second multi-aperture plate 214 are formed along the circumference direction of the second multi-aperture plate 214 in correspondence to eight secondary electron beams positioned on the circumference about the optical axis, such that they are at equal intervals when projected onto the y-direction.

Thus, a plurality of apertures of the second multi-aperture plate 214 are formed to prevent different groups of secondary electron beams from introducing into apertures not associated therewith, thereby making it possible to prevent the occurrence of cross-talk and to limit an influence of the aberration of the secondary optical system even if the optical system is not provided with a diaphragm. Further, the elimination of the need for providing the diaphragm can lead to the elimination of the need for providing an aligner for adjustor lenses, an aligner for the diaphragm, and an stigmator for the cross-over, thereby simplifying the configuration of the apparatus and reducing the size of the overall apparatus.

As will be understood from the foregoing description, in the electron beam apparatus according to the present invention, a plurality of primary electron beams are incident on a sample, secondary electrons emitted from the sample are accelerated and separated from the primary optical system to form a plurality of secondary electron beams. The plurality of secondary electron beams are incident on the secondary optical system and focused on detecting means which outputs detection signals of the secondary electron beams, wherein a plurality of apertures are provided in front of the detecting means in correspondence to the plurality of secondary electron beams. Since the plurality of apertures are formed to prevent secondary electron beams from introducing into the apertures not corresponding thereto, the resulting electron beam apparatus can prevent the occurrence of cross-talk, limit the influence of aberration of the optical system, and improve the secondary electron detection efficiency.

Figures 6A, 6B:
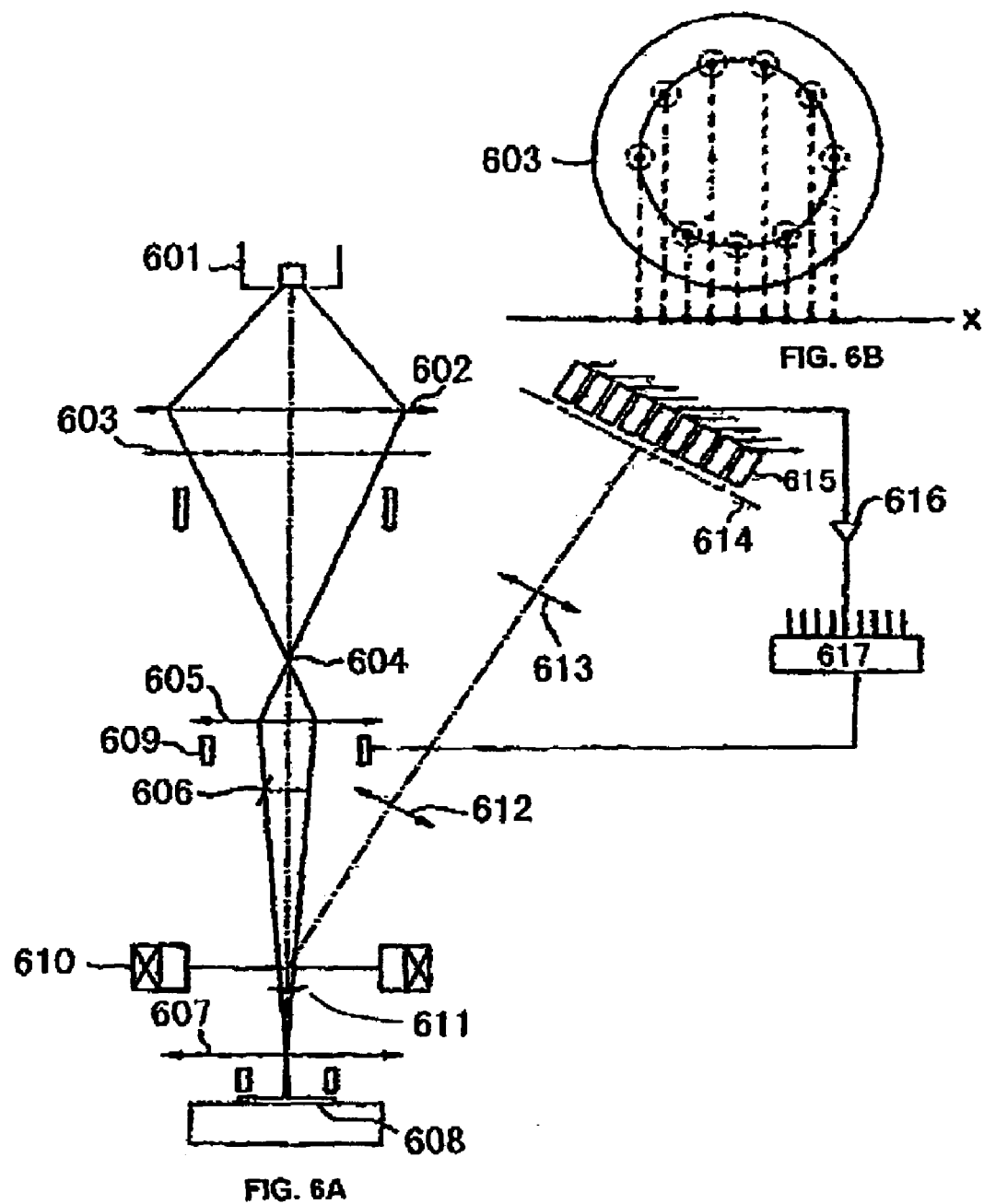
FIG. 6A is a diagram schematically illustrating the configuration of a second embodiment of the electron beam apparatus according to the present invention.
FIG. 6B is a plan view showing a positional relationship between apertures formed through two multi-aperture plates in FIG. 6A.

FIG. 6A is a diagram schematically illustrating a second embodiment of the electron beam apparatus according to the present invention. In FIG. 6A, electron beams emitted from an electron gun 601 of the electron beam apparatus 600 are converged by a condenser lens 602 to form a cross-over at a point 604.

Below the condenser lens 602, a first multi-aperture plate 603 having a plurality of apertures is disposed orthogonal to the optical axis W, for forming a plurality of primary electron beams. Each of the primary electron beams formed by the first multi-aperture plate 603 is reduced by a reducing lens 605, focused on and projected onto a point 606, and then focused on a sample 608 by an objective lens 607. A plurality of primary electron beams exiting from the first multi-aperture plate 603 are deflected by a deflector 609 disposed between the reducing lens 605 and objective lens 607 to simultaneously scan on the surface of the sample 608.

For eliminating the influence of field curvature aberration of the reducing lens 605 and objective lens 607, the first multi-aperture plate 603 is formed with small apertures on the circumference which are arranged at equal intervals when they are projected onto the x-axis, as illustrated in FIG. 6B. Circles drawn by dotted lines in FIG. 6C Indicate apertures formed through a second multi-aperture plate 614, later described.

A plurality of points on the sample 608 are irradiated with a plurality of focused primary electron beams. Secondary electron beams emitted from the plurality of irradiated points are accelerated by an electric field of the objective lens 607, narrowly converged, deflected by an ExB separator 610, and introduced into a secondary optical system. A secondary electron image focuses on a point 611 closer to the objective lens 607 than the ExB separator 610. This is because each primary electron beam has energy of 500 eV on the surface of the sample 608, whereas secondary electron beams merely have energy of several eV. It is desirable that the secondary electron image is designed around the ExB separator to reduce deflection chromatic aberration of the ExB separator.

The secondary optical system has magnifying lenses 612, 613. The secondary electron beams, which have passed through these magnifying lenses 612, 613, focus on a plurality of apertures of the second multi-aperture plate 614. Then, through the apertures, the secondary electron beams are guided to a plurality of detectors 615. As illustrated In FIG. 6B, a plurality of apertures formed through the second multi-aperture plate 614 disposed in front of the detectors 615 correspond one-to-one to a plurality of apertures formed through the first multi-aperture plate 603.

Each of the detectors 615 converts a detected secondary electron beam to an electric signal indicative of its intensity. The electric signal output from each of the detectors is amplified by an amplifier 616, and then received by an image processing unit 617 for conversion into image data. Since the image processing unit 617 is also supplied with a scanning signal for deflecting the primary electron beams, the image processing unit 617 displays an image which represents the surface of the sample 608. Defects on the sample 608 can be detected by comparing this image with a standard pattern.

In this event, it is necessary to pay special attention to minimize the influence of three types of aberration, i.e., distortions, axial chromatic aberration, and field astigmatism produced in the primary optical system, when the primary electron beams passing through the apertures of the first multi-aperture plate 603 are focused on the surface of the sample 608, and secondary electron beams emitted from the sample 608 are guided to the detectors 615. Also, in regard to the relationship between the interval of a plurality of primary electron beams and the secondary optical system, the cross-talk between a plurality of beams can be eliminated by setting the interval of the primary electron beams larger than the aberration of the secondary optical system.

FIGS. 7A to 7C illustrate the structure of a multi-emitter type thermal cathode 601 of the electron beam apparatus 600 illustrated In FIG. 6A, wherein FIG. 7A is a plan view, FIG. 7B is a side view, and FIG. 7C is an enlarge view of a bump. As Illustrated in FIGS. 7A and 7B, a plurality of bumps 701–708 (eight in FIG. 7A) are formed along a predetermined circumference on the top face of the thermal cathode 601 by a discharge machining electrode, later described, such that they are arranged at equal intervals, when viewed from a side, as illustrated in FIG. 7B. These bumps 701–708 correspond to the emitters in FIG. 6A, respectively. The thermal cathode 601 is formed with two parallel surfaces 709 on the back for heating.

Figure 8A:
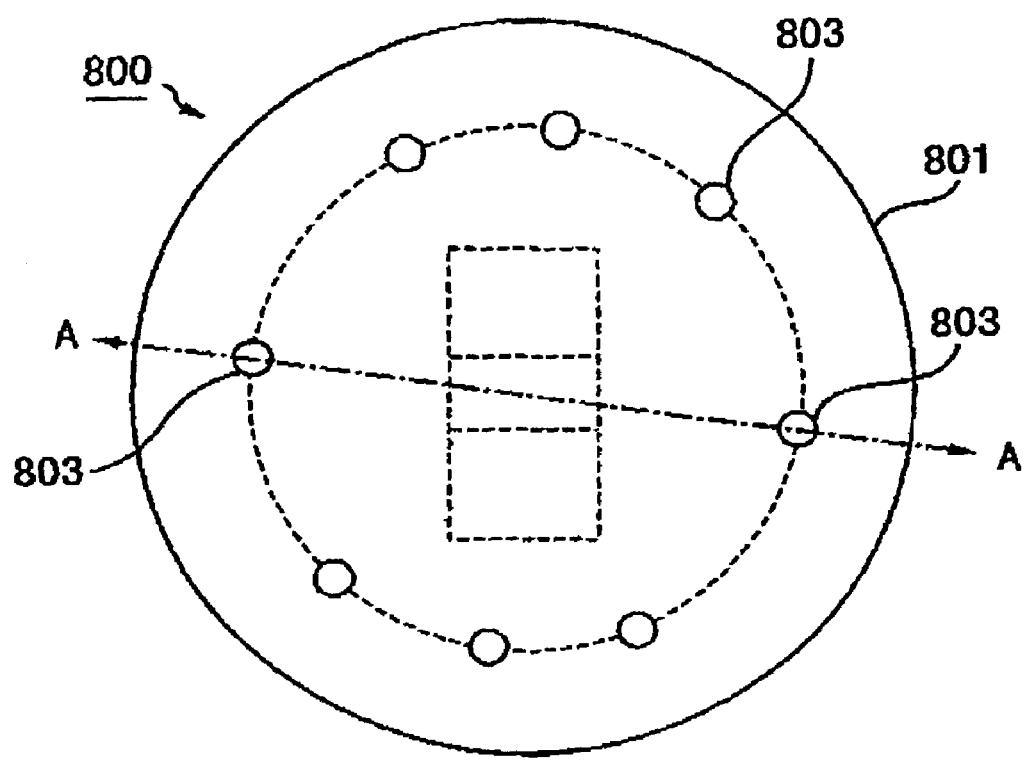
Figure 8B:
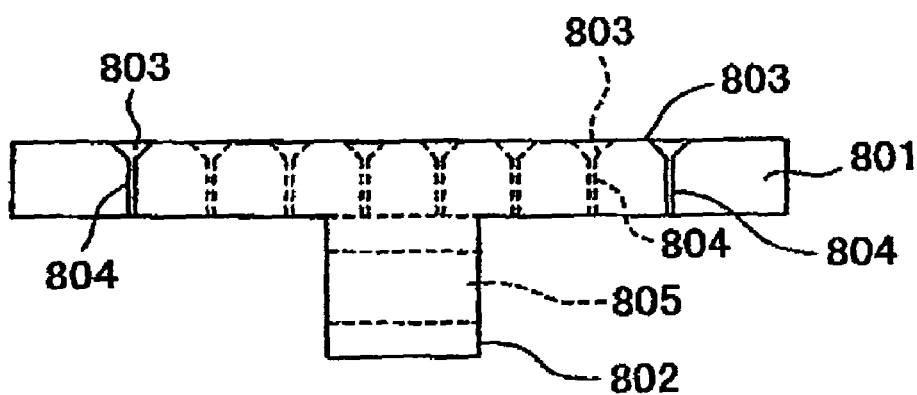

As Illustrated in an enlarged view of FIG. 7C, a leading end portion of the bump 705 comprises a cylinder $705_1$ and a peak face $705_2$. The cylinder $705_1$ and peak face $705_2$ will be referred to in the description later made in connection with FIGS. 8A and 8B. The remaining bumps 701–704, FIGS. 8A and 8B are diagrams schematically illustrating the structure of the discharge machining electrode 800 for manufacturing the thermal cathode 601 illustrated in FIG. 7A, where FIG. 8A is a plan view, and FIG. 8B is a cross-sectional view taken along a line A—A. In FIGS. 8A and 8B, the discharge machining electrode 800 comprises a disk 801 made of a tungsten-silver alloy: and a protrusion 802 provided on the back of the disk 801 for attachment to an electric discharge machine (not shown). Conical recesses 803 are formed on the surface of the disk 801 at positions corresponding to the bumps 701–708 in FIG. 7A. Each of the recesses 803 is communicated with a small hole 804 for smoothly circulating an insulating oil during electric discharge machining. Each of the small holes 804 has a diameter of, for example, 100 microns and a vertex angle of, for example, 90 degrees. Reference numeral 805 in FIG. 8B designates a hole for coupling a lead wire for applying the discharge machining electrode 800 with a discharge current.

With the discharge machining electrode 800 illustrated in FIG. 8A, a multi-emitter type thermal cathode 601 can be manufactured in the shape illustrated in FIG. 7A from an arbitrary conductive material, for example, a material under machining made of $LaB_6$ single crystal, Ta, Hf, tungsten or the like, Thus, the shape of the bumps 701–708 on the thermal cathode 601 are complimentary to the shape of the recesses 803 on the discharge machining electrode 800. However, since the discharge machining electrode 800 comprises the small holes 804 for circulating an insulating oil, the peak faces $705_2$, which have been previously mirror-machined prior to the electric discharge machining, remain at the leading ends of the bumps 705 to the last, as illustrated in FIG. 7B. The cylinder $705_1$ in communication with the peak face $705_1$ is smaller in diameter than the small hole 704 by 10 to 20 microns.

Assuming, for example, that the cylinder $705_1$ has a height of 20 microns, the tolerance for the accuracy in the electric discharge machining is up to 20 microns in the bump height direction, so that the parallelism may be low between the discharge machining electrode 800 and a material under machining.

As described above, the electric discharge machining is performed with the discharge machining electrode 800 in an insulating oil, and a material under machining, which is to be machined into the thermal cathode, is significantly heated as well, thereby possibly causing components of the insulating oil to diffuse into the surface of the material under machining to degrade the performance as the thermal cathode. To avoid the degraded performance, the peak faces (designated by numeral $705_2$ in FIG. 7C) of the respective bumps 701–708 may be polished or chemically mechanically polished by five to ten microns to make mirror surfaces after the electric discharge machining is completed. In this event, it is not necessary to mirror-polish the surface of the material under machining prior to the electric discharge machining.

Since the discharge machining electrode 800 as described is used for electric discharge machining, even a hard and fragile material such as $LaB_6$ single crystal can undergo the electric discharge machining without fail. Of course, the electric discharge machining may be repeated using an electrode which has only one each of recess 803 and small hole 804.

Figure 9A:
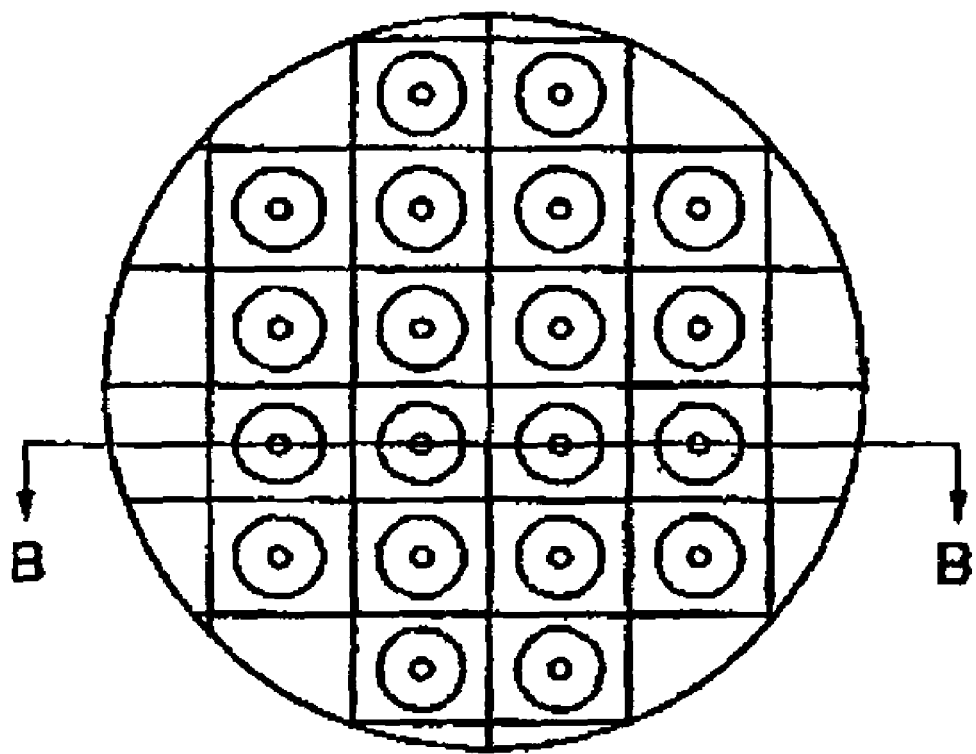
FIG. 9A is a plan view of a material under machining which is formed with bumps in XY-directions.
Figure 9B:
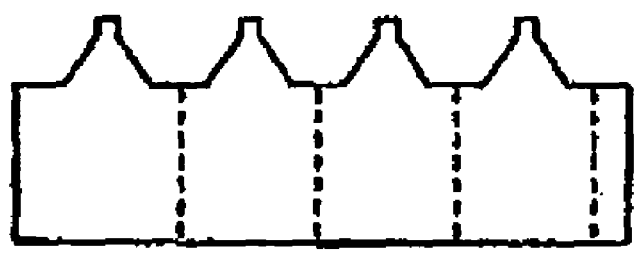
FIG. 9B is a cross-sectional view taken along a line B—B in FIG. 9A.

Taking advantage of the foregoing features of the present invention, a large number of single cathodes can be readily manufactured. Describing this with reference to FIGS. 9A and 9B, a material under machining undergoes the electric discharge machining, using the discharge machining electrode 800 which has the recesses regularly arranged in the XY-directions to regularly form bumps on the material under machining in the XY-directions, as illustrated in FIG. 5A. Subsequently, the material under machining is cut along vertical and horizontal solid lines in FIG. 5A into individual elements, thereby making It possible to produce a large number of tips only with a single mirror polishing operation.

The electron beam apparatus in the configuration illustrated in FIG. 6A may be applied as well when a single emitter is used.

As will be understood from the foregoing description, the present invention provides particular effects as follows.

(1) A variety of conductive materials can be utilized because the employed discharge machining electrode can machine even a hard and fragile material for a cathode such as $LaB_6$.

(2) Since the peaks of the bumps formed by the electric discharge machining are machined to a mirror-smooth state before or after the electric discharge machining, the planarity of a material under machining is not affected by the electric discharge machining.

(3) The respective bumps can be machined such that cylinders are left at the respective leading ends thereof to provide the bumps with a uniform area at the leading ends thereof.

(4) The accuracy of the electric discharge machining need not be taken into consideration.

(5) Even when a single cathode is created, a large number of emitters can be manufactured through a single mirror polishing operation and a single electric discharge machining operation.

Figure 10:
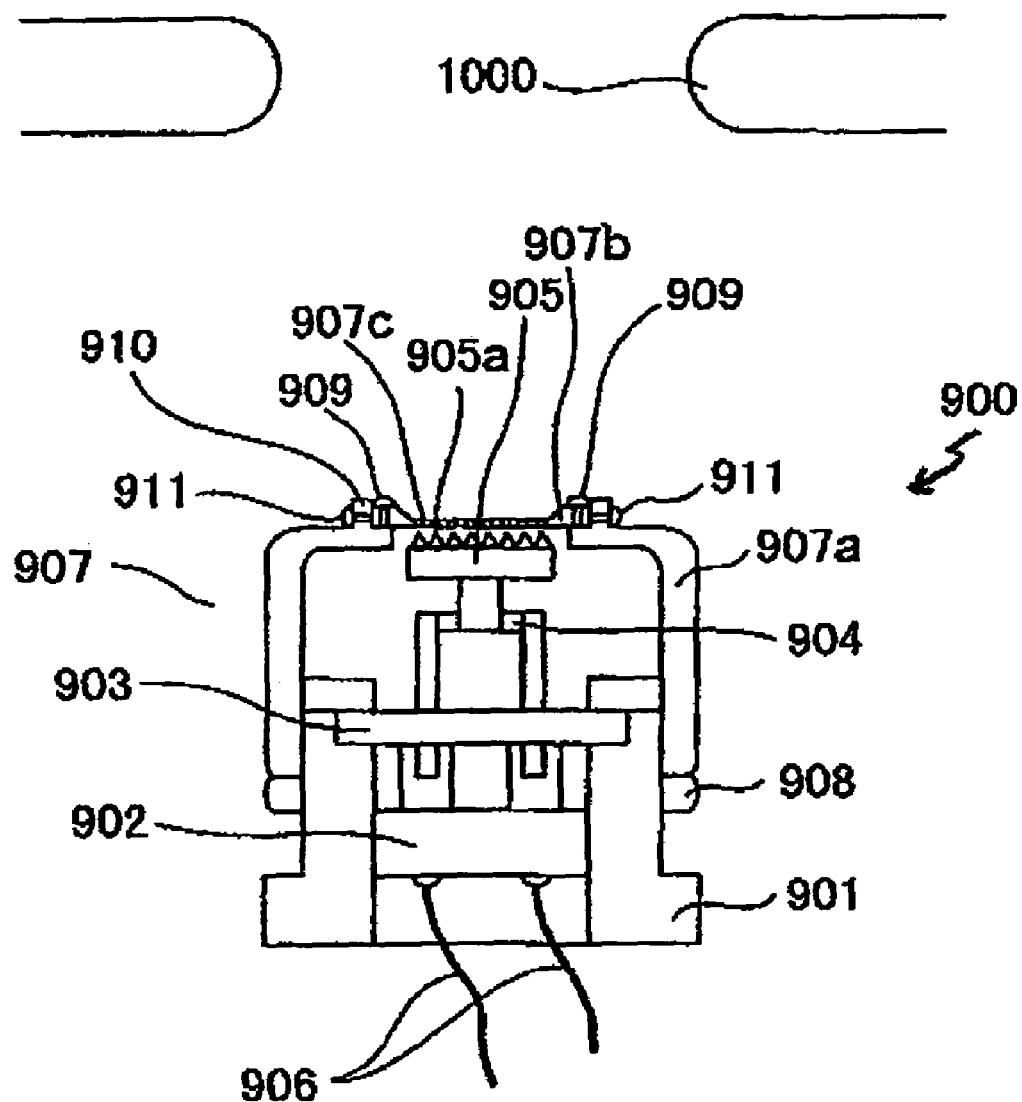
FIG. 10 is a diagram schematically illustrating an exemplary electron gun which can be used in the electron beam apparatus according to the present invention.

FIG. 10 is a vertical sectional view schematically illustrating an exemplary electron gun which can be used in the electron beam apparatus illustrated in FIG. 6A. The electron gun 900 comprises a cylindrical electron gun body 901 which is positioned below an anode member 1000, and an insulating ceramics 902 is fixed inside of the electron gun body 901. A bottom face of a ceramic seat 903 is fixed on a top face of the insulating ceramics 902. A multi-emitter 905 is fixed on the ceramic seat 903 such that the multi-emitter 905 is heated by a heater 904. The multi-emitter 905 is created as a cathode which has a plurality of emitters 905a integrated thereon.

High voltage cables 906 for the heater 904 and cathode extend from the bottom face of the insulating ceramics 902. Thus, the multi-emitter 905 and heater 904 are fixed in the electron gun body 901 by the ceramic seat 903 and insulating ceramics 902. Therefore, these members can be assembled into a structure which ensures a sufficient rigidity. Also, by accurately machining the respective members, the parallelism of the multi-emitter 905 to the electron gun body 901 is also fixed at a strict value.

As the multi-emitter 905 has been assembled into the electron gun body 961, a Wehnelt electrode 907 is next attached to the electron gun body 901. The Wehnelt electrode 907 is comprised of a Wehnelt electrode body 907a, and a multi-aperture plate 907b which can be separated from the Wehnelt electrode body 907a. The multi-aperture plate 907b can be fitted into an opening at a leading end of the Wehnelt electrode body 907a.

The multi-aperture plate 907b is circular, and has a plurality of small holes corresponding to the respective emitters 905a of the multi-emitter 905, i.e., multi-Wehnelt holes 907c. The multi-aperture plate 907b has a thickness of 200 µm or less, and preferably 100 µm or less in the vicinity of the multi-Wehnelt holes 907c, and has a thicker periphery because screws of a fine adjustment mechanism, later described, are abutted thereto.

Initially, the Wehnelt electrode body 907a alone is attached to the electron gun body 901. The cylindrical Wehnelt electrode body 907a is rotatably fitted on the similarly cylindrical electron gun body 901. As the Wehnelt electrode body 907a reaches a desired axial position with respect to the multi-emitter 905, the Wehnelt electrode body 907a is fixed by a stop ring 908.

Next, the multi-aperture plate 907b is attached to the opening at the leading end of the Wehnelt electrode body 907a. The multi-aperture plate 907b is located adjacent to the multi-emitter 905 within the Wehnelt electrode 907. The multi-aperture plate 907b is attached to the periphery of the opening by axial screws 909 provided at three locations. A leading end of a horizontal screw 911 abuts to the peripheral surface of the multi-aperture plate 907b. The horizontal screw 911 extends through a plurality of lugs 910 provided on the Wehnelt electrode body 907a.

These screws 909, 911 make up a fine adjustment mechanism for finely adjusting the position of the multi-aperture plate 907b. Specifically, as all of the three screws 909 are rotated by the same amount while viewing them with a microscope, the position of the multi-aperture plate 907b can be finely adjusted In the z-direction, i.e., in the direction perpendicular to a plane which includes the multi-emitter 905. As the three screws 909 are individually manipulated, the position of the multi-aperture plate 907b can be finely adjusted in a tilt direction, i.e., in a tilt direction in a plane perpendicular to the plane which includes the multi-emitter 905. Through the fine adjustment in the tilt directions, the parallelism of the multi-aperture plate 907b can be adjusted with respect to the multi-emitter 905.

Also, by rotating the Wehnelt electrode body 907a relative to the electron gun body 901, the position of the multi-aperture plate 907b can be finely adjusted in a θ-direction, i.e., the rotating direction in a plane parallel to the plane which includes the multi-emitter 905. This rotatable configuration of the Wehnelt electrode body 907a also forms part of the fine adjustment mechanism.

Further, as the screws 909 are individually operated, the position of the multi-aperture plate 907b can be finely adjusted in the x-direction and y-direction in a plane parallel to the plane which includes the multi-emitter 905 to align the multi-Wehnelt holes 907c to a plurality of emitters 905a of the multi-emitter 905.

In this way, the electron gun body 901, multi-emitter 905, and multi-aperture plate 907b can be assembled with a high accuracy while maintaining a high parallelism to one another, and the multi-Wehnelt holes 907c can be readily aligned to the associated emitters 905a. As a result, the respective emitters 905a can operate substantially in the same manner to limit variations in emission current within a predetermined range. Since the multi-aperture plate 907b is attached after the Wehnelt electrode body 907a is assembled, it is quite unlikely to destruct the multi-emitter 41 during the assembly.

Further, since the mechanism for adjusting the tilt of the Wehnelt plane to the emitter plane is located at the same z-position as the emitter plane or Wehnelt plane, they will not go out of alignment In the x-, y- or z-direction when the tilt is adjusted.

As will be understood from the foregoing description, according to the electron gun of the present invention, the multi-emitter and Wehnelt electrode can be accurately assembled and readily aligned to each other while the parallelism is maintained to each other. As a result, the respective emitters can operate substantially in the same manner to limit variations in emission current within a predetermined range. Also, the Wehnelt electrode can be separated into the body and multi-aperture plate, so that the aperture plate adjacent to the multi-emitter can be attached after the assembly of the Wehnelt electrode body, thereby significantly reducing the possibility of destructing the multi-emitter through contact. Further, as the multi-emitter, heater and insulating ceramics are previously fixed with respect to the electron gun body, an assembling time can be reduced, and a discrepancy can be substantially eliminated during an adjustment and after heating. In addition, when the electron gun of the present invention is used, the electron beam apparatus can be safely operated with multiple beans.

Figure 11:
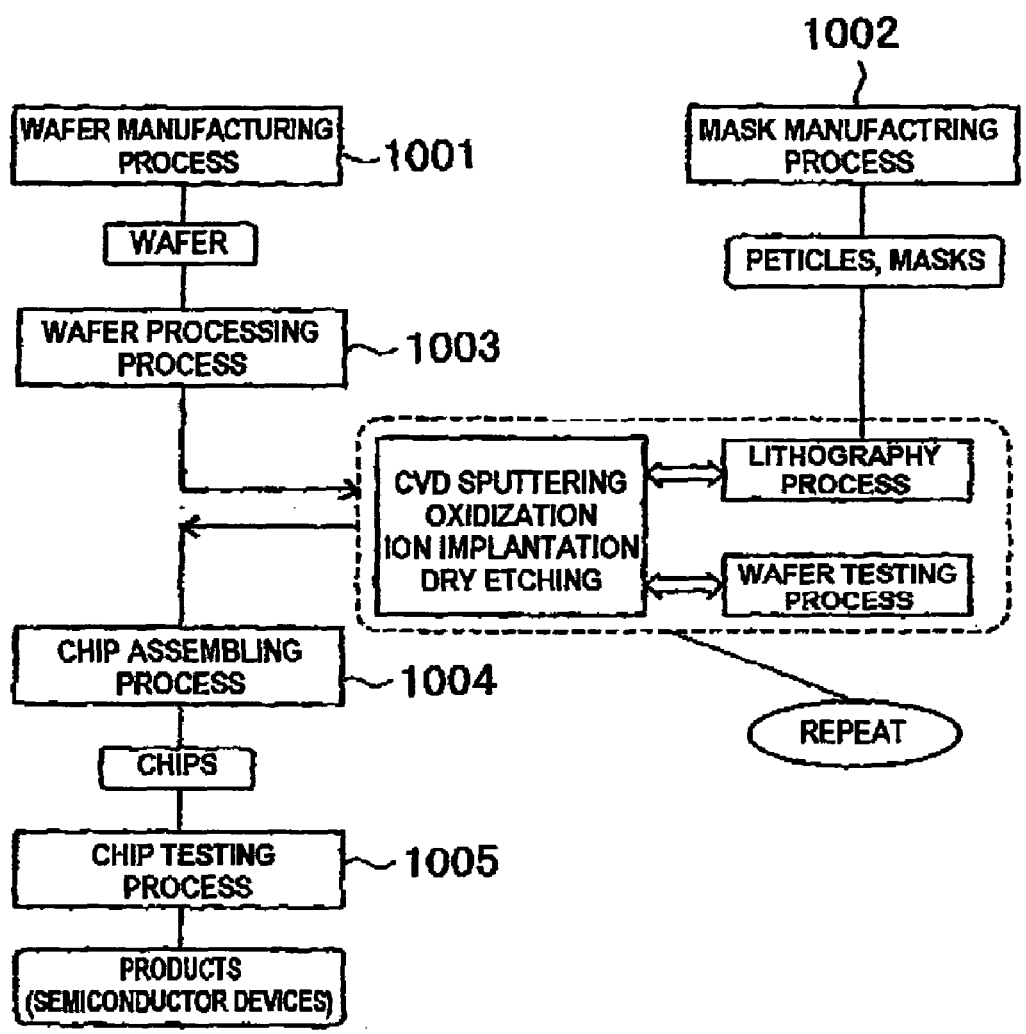
FIG. 11 is a flow diagram illustrating an exemplary semiconductor device manufacturing method using the electron beam apparatus according to the present invention.

The electron beam apparatus according to the present Invention described above can be used to evaluate samples in a semiconductor device manufacturing method. FIG. 11 is a flow chart illustrating an example of such a semiconductor device manufacturing method. The manufacturing processes include the following main processes:

(1) a wafer manufacturing process for manufacturing wafers (or a wafer preparing process for preparing wafers) (process 1001);

(2) a mask manufacturing process for manufacturing masks for use in exposure (or a mask preparing process for preparing masks) (process 1002);

(3) a wafer processing process for performing required processing on the wafer (process 1003);

(4) a chip assembling process for dicing the wafer into individual chips and making each chip operable (process 1004); and (5) a chip testing process for testing the finished chips (process 1005).

Each of these processes includes several sub-processes. Among these processes, the wafer processing process 1062 exerts a deterministic influence on the performance of semiconductor devices. In this process, designed circuit patterns are laminated in sequence on a wafer to form a multiplicity of chips which may operate as a memory or a microprocessor unit. The wafer processing process includes the following processes:

(1) a thin film forming process for forming dielectric thin films which serve as an insulating layer, a metal thin film for forming wires or electrodes, and the like (using CVD, sputtering and the like);

(2) an oxidizing process for oxidizing the thin film layers and a wafer substrate;

(3) a lithography process for forming a resist pattern using masks (reticles) for selectively processing the thin film layers, wafer substrate and the like;

(4) an etching process for processing the thin film layers and wafer substrate in accordance with the resist pattern (using, for example, a dry etching technique);

(5) an ion/impurity injection and diffusion process;

(6) a resist removing process; and (7) a testing process for testing the processed wafer.

The wafer processing process is repeatedly executed as many times as the number of required layers in order to manufacture semiconductor devices which operate as designed.

Figure 12:
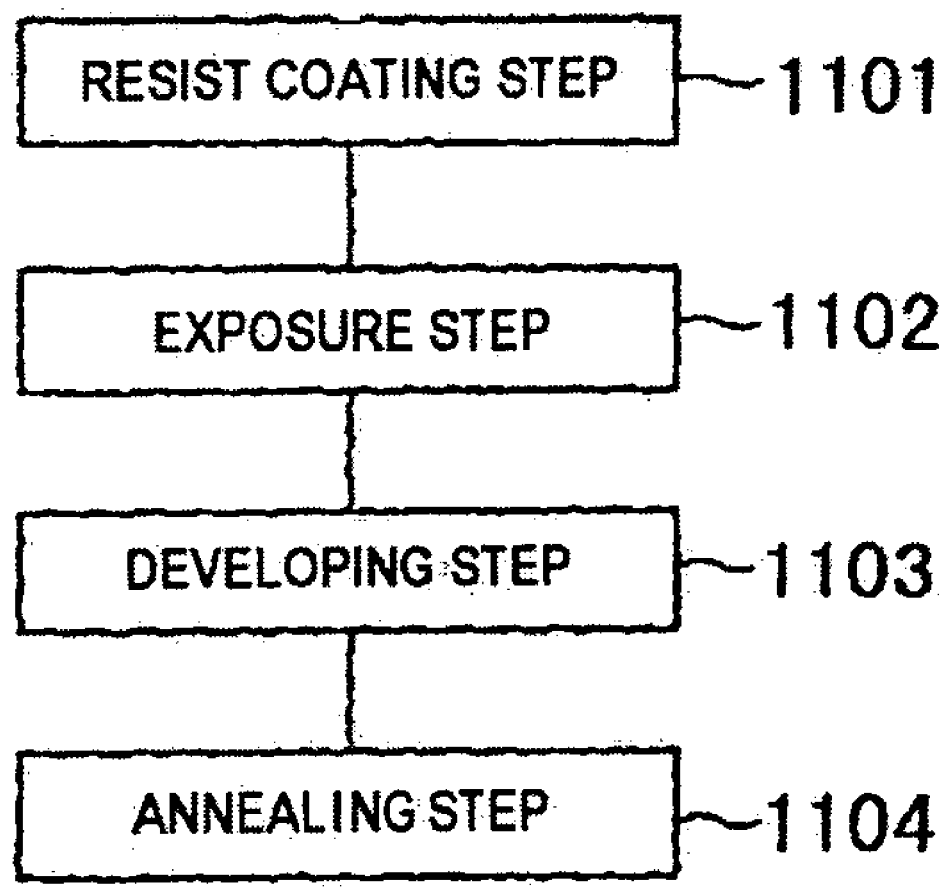
FIG. 12 is a flow diagram illustrating a lithography process which is the core of a wafer processing process in FIG. 11.

FIG. 12 is a flow chart illustrating the lithography process which is the core of the wafer processing process 1002 in FIG. 11. The lithography process includes:

(1) a resist coating step for coating a resist on the wafer formed with circuit patterns In the previous process (step 1101):

(2) an exposure step for exposing the resist (step 1102);

(3) a developing step for developing the exposed resist to create a resist pattern (step 1103); and (4) an annealing step for annealing the developed resist pattern for stabilization (step 1104).

Since the semiconductor device manufacturing process, wafer processing process, and lithography process are well known in the art, further description thereon is omitted here.

The electron beam apparatus according to the present invention, when applied to the aforementioned testing process (7), permits a test to be conducted with high throughput even on those semiconductor devices which have miniature patterns, thereby providing for a total inspection, increasing the yield rate for products, and preventing shipment of defective products

INDUSTRAIL AVAILABILITY

Since the present invention provides an electron beam apparatus which can limit aberration in a secondary optical system, reduce shot noise, and readily and accurately align a multi-emitter to a Wehnelt, held in parallel with each other, the electron beam apparatus is suitable for evaluating samples in a semiconductor manufacturing process.

The invention claimed is:

1. An electron beam apparatus comprising:
an electron gun for directing a plurality of primary electron beams onto a sample;
objective lens for forming an electric field to accelerate a plurality of secondary electron beams emitted from said sample;
a separator for separating said plurality of secondary electron beams from a primary optical system and for directing said plurality of secondary electron beams into a secondary optical system for guiding to a detector outputting a detection signal of the plurality of secondary electron beams; and
a deflector for deflecting said secondary electron beams in said secondary optical system, wherein said deflector is controlled to deflect said plurality of secondary electron beams to prevent said plurality of secondary electron beams from moving on said detector in response to the scanning of said plurality of primary electron beams.

2. An electron beam apparatus according to claim 1, wherein said plurality of primary electron beams and said plurality of secondary electron beams are arranged in a vicinity of an optical axis.

3. An electron beam apparatus according to claim 1, further comprising a plate having a plurality of apertures corresponding to said plurality of secondary electron beams in front of said detector.

4. An electron beam apparatus comprising:
an electron gun for directing a plurality of primary electron beams onto a sample;
objective lens for forming an electric field to accelerate a plurality of secondary electron beams emitted from the sample;
a separator for separating the plurality of secondary electron beams from a primary optical system and for directing the plurality of secondary electron beams into a secondary optical system for guiding to detectors outputting a detection signal of the plurality of secondary electron beams;
a deflector for scanning the plurality of primary electron beams onto the sample;
a number of memories twice as much as a number of said detectors for storing digital signals generated by A/D converting circuits; and
change-over switches disposed in front of and at a back of said memories, wherein the detection signal from said detectors is input in one of said memories while the previous detection signals stored in another of said memories are transmitted into a CPU or an image processing unit.

5. An electron beam apparatus, comprising:
an electron gun having a cathode electrode, a Wehnelt electron and an anode electrode;
wherein said electron gun further comprises a multi-emitter machined as a cathode including a plurality of emitters integrated thereon, a heater for heating said multi-emitter, a supporter for fixing said multi-emitter and said heater at given positions, and a fine adjustment mechanism for finely adjusting the position of a portion of said Wehnelt electrode which is adjacent to said multi-emitter,
wherein said fine adjustment mechanism is configured to be able to finely adjust the position of said portion of said Wehnelt electrode in at least one of an x-direction, a y-direction, and a θ-direction in a plane parallel to a plane which includes said multi-emitter, and a tilt direction in a plane perpendicular to said plane.

6. An electron beam apparatus according to claim 5, wherein said fine adjustment mechanism in the θ-direction or tilt direction is disposed at a z-position substantially identical to that of said emitter.

7. An electron beam apparatus according to claim 5, wherein said portion of said Wehnelt electrode has a plurality of small holes corresponding to said plurality of emitters, and has a thickness of 200 μm or less only in the vicinity of said holes.

8. An electron beam apparatus according to claim 5, wherein said electron gun can emit a plurality of narrowed electron beams for scanning a sample surface and has a plurality of detectors for detecting secondary electron beams emitted from the sample surface by illumination of said electron beam.

9. An electron beam apparatus, comprising:

an electron gun for directing a plurality of primary electron beams onto a sample;

a condenser lens for converging the plurality of primary electron beams emitted from said electron gun;

a multi-aperture plate having a plurality of apertures;

a demagnification lens for demagnifying the plurality of primary electron beams;

an objective lens for forming an electric field to accelerate a plurality of secondary electron beams emitted from said sample;

a director for directing said plurality of secondary electron beams into a secondary optical system for guiding to a detector outputting a detection signal of the secondary electron beams; and a beam separator disposed between the objective lens and a former stage lens in a primary optical system for separating said secondary electron beams, wherein said condenser lens forms a crossover image at a point between said multi-aperture plate and said demagnification lens.

* * * * *